(12) United States Patent
Delshadpour et al.

(10) Patent No.: US 12,063,036 B2
(45) Date of Patent: Aug. 13, 2024

(54) POWER APPLICATION CIRCUIT

(71) Applicant: NXP USA, Inc., Austin, TX (US)

(72) Inventors: Siamak Delshadpour, Phoenix, AZ (US); Ahmad Dashtestani, Gilbert, AZ (US); Mona Ganji, Ames, IA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/154,335

(22) Filed: Jan. 13, 2023

(65) Prior Publication Data

US 2024/0243745 A1 Jul. 18, 2024

(51) Int. Cl.
| H03K 19/01 | (2006.01) |
| G05F 1/46 | (2006.01) |
| H03K 3/037 | (2006.01) |
| H03K 19/0185 | (2006.01) |
| H03K 17/22 | (2006.01) |

(52) U.S. Cl.
CPC ....... *H03K 19/018507* (2013.01); *G05F 1/46* (2013.01); *H03K 3/037* (2013.01); *H03K 17/22* (2013.01)

(58) Field of Classification Search
CPC .................. G05F 1/46; H03K 19/20
USPC .................................. 327/544–546
See application file for complete search history.

(56) References Cited

U.S. PATENT DOCUMENTS

| 6,091,987 A * | 7/2000 | Thompson | G05F 3/242 607/2 |
| 6,201,437 B1 * | 3/2001 | Kono | G05F 1/465 327/143 |
| 6,583,974 B1 | 6/2003 | Juntunen et al. | |
| 7,982,498 B1 * | 7/2011 | Chen | H03K 3/35613 326/63 |
| 8,791,743 B1 * | 7/2014 | Tang | H03K 3/356104 327/333 |
| 10,032,507 B2 | 7/2018 | Ngo et al. | |
| 10,446,196 B1 * | 10/2019 | Narasimhan | G11C 5/147 |
| 10,637,462 B1 * | 4/2020 | Pulipati | H03K 19/01759 |
| 11,442,108 B1 * | 9/2022 | Srinivasan | G01R 31/31713 |
| 11,513,544 B1 * | 11/2022 | Srinivasan | G05F 1/46 |
| 2006/0077002 A1 * | 4/2006 | White | H03K 19/0019 327/544 |
| 2009/0183019 A1 | 7/2009 | Allen et al. | |
| 2016/0124448 A1 * | 5/2016 | Murukumpet | G05F 1/569 323/268 |
| 2018/0123590 A1 * | 5/2018 | Yagishita | H03K 19/0948 |
| 2021/0288644 A1 * | 9/2021 | Wu | H03K 17/6872 |
| 2022/0085812 A1 * | 3/2022 | Singh | H03K 19/018521 |

* cited by examiner

*Primary Examiner* — Quan Tra

(57) ABSTRACT

One example discloses a power application circuit, including: a first power application circuit, configured to receive an enable signal and a first voltage; wherein the first power application circuit is configured to output the first voltage at a first current after a first delay from when the enable signal is received; and a second power application circuit, configured to receive the enable signal and a second voltage; wherein the second power application circuit is configured to output the second voltage at a second current after a second delay from when the enable signal is received.

18 Claims, 6 Drawing Sheets

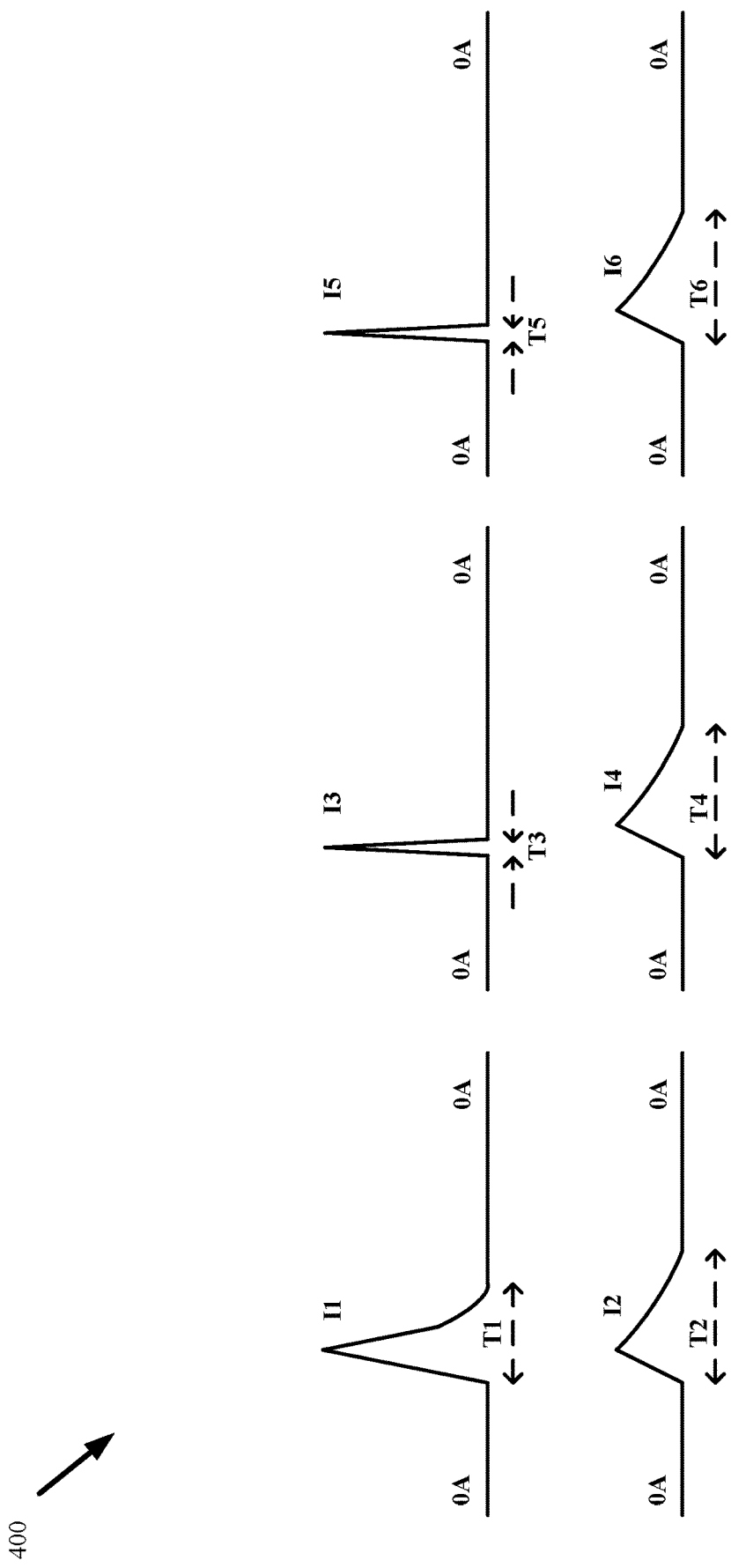

POWER APPLICATION CIRCUIT

The present specification relates to systems, methods, apparatuses, devices, articles of manufacture and instructions for power application to one or more circuits.

SUMMARY

According to an example embodiment, a power application circuit, comprising: a first power application circuit, configured to receive an enable signal and a first voltage; wherein the first power application circuit is configured to output the first voltage at a first current after a first delay from when the enable signal is received; and a second power application circuit, configured to receive the enable signal and a second voltage; wherein the second power application circuit is configured to output the second voltage at a second current after a second delay from when the enable signal is received.

In another example embodiment, an enable signal circuit is configured to receive the enable signal; wherein the enable signal circuit is configured to output a delayed enable signal after a third delay from when the enable signal is received.

In another example embodiment, the first power application circuit includes a first switch configured to output the first voltage at the first current after the first delay from when the enable signal is received.

In another example embodiment, the second power application circuit includes a first switch configured to output the second voltage at the second current after the second delay from when the enable signal is received.

In another example embodiment, the first power application circuit includes a second switch configured to continuously output the first voltage at a third current.

In another example embodiment, the second power application circuit includes a second switch configured to continuously output the second voltage at a fourth current.

In another example embodiment, the first power application circuit is configured to supply the first voltage and the first current to a set of level shifters; and the second power application circuit is configured to supply the second voltage and the second current to the set of level shifters.

In another example embodiment, the set of level shifters are configured to power on in response to receiving the enable signal.

In another example embodiment, the set of level shifters are configured to power on in response to receiving the delayed enable signal.

In another example embodiment, the set of level shifters are coupled between a digital circuit and an analog circuit.

In another example embodiment, the set of level shifters are configured to convert an analog signal at the first voltage received from the analog circuit to a digital signal at the second voltage sent to the digital circuit; and the set of level shifters are configured to convert a digital signal at the second voltage received from the digital circuit to an analog signal at the first voltage sent to the analog circuit.

In another example embodiment, the first power application circuit is configured to supply power to the digital circuit, and the second power application circuit is configured to supply power to the analog circuit.

In another example embodiment, the digital circuit, the analog circuit, the first power application circuit, and the second power application circuit are configured to receive power directly from a main power supply.

In another example embodiment, the first power application circuit is configured to supply power to a first set of level shifters; and the second power application circuit is configured to supply power to a second set of level shifters that are different from the first set of level shifters.

In another example embodiment, the power application circuit is configured to be coupled to supply the first voltage, the first current, the second voltage, and the second current to a multi-power source mixed-signal circuit.

In another example embodiment, the power application circuit is configured to receive power from a power supply; and the power application circuit receives the first voltage, the second voltage, and the enable signal from the power supply.

In another example embodiment, the second voltage is received from a cap-less low-dropout (LDO) voltage regulator in the power supply.

In another example embodiment, the capless LDO is configured to convert the first voltage to the second voltage using only a capacitor internal to a semiconductor chip in which the power supply is embedded.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

BRIEF DESCRIPTION OF THE DRAWINGS

FIGS. 4A, 4B and 4C represent example transient (e.g. shoot through) current waveforms.

Figure 1:
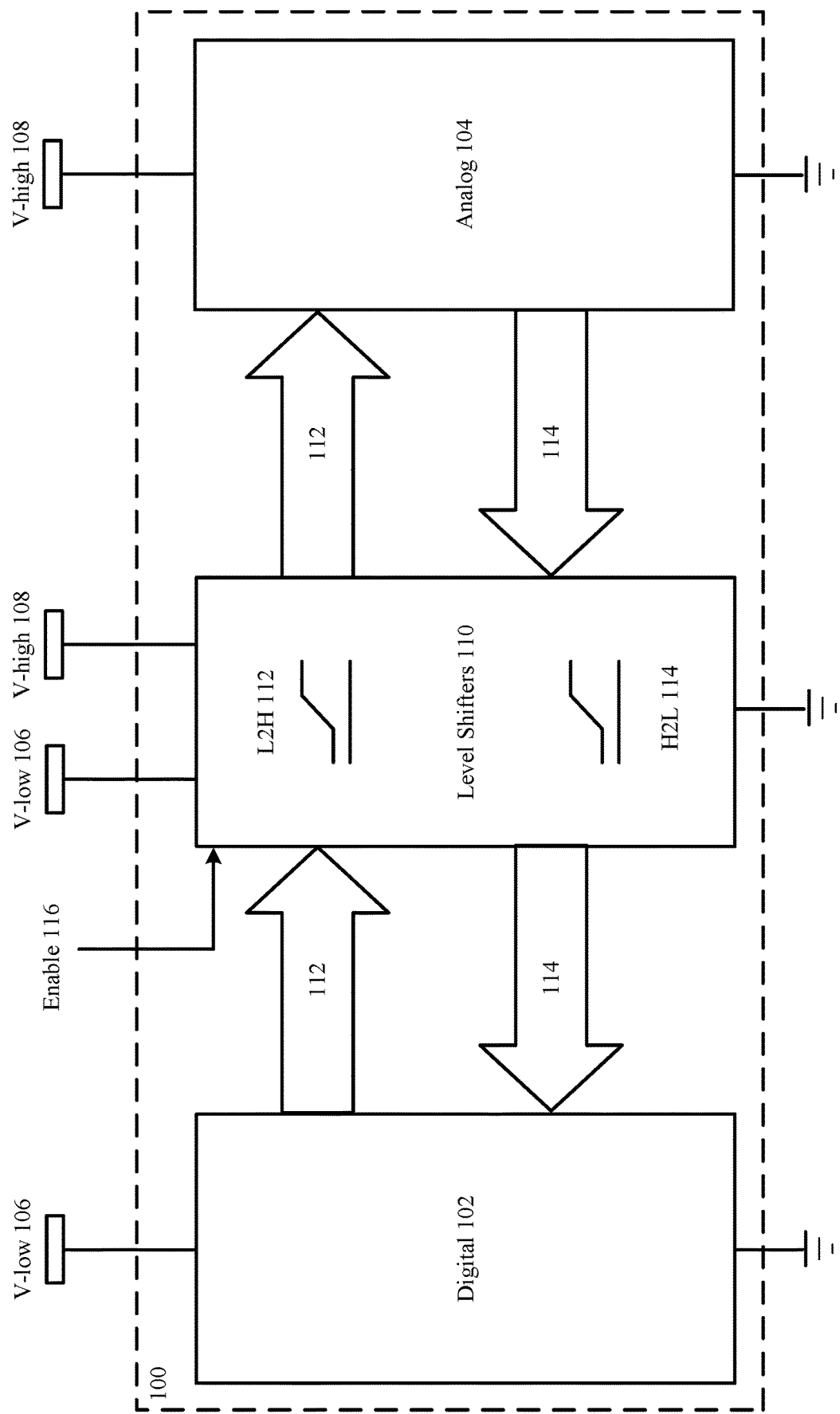
FIG. 1 represents an example multi-power source mixed-signal circuit.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

When applying a supply voltage to a mixed-signal circuit, enabling a set of level shifters, effecting a POR (power on reset), etc., large transient currents may be drawn from the supply that may prevent proper circuit operation unless protections are in place.

For example, mixed-signal circuits (i.e. mixed-mode circuits) include both digital and analog circuits. The digital circuits usually operate using a lower supply voltage, and the analog circuits operate using a higher supply voltage.

Low to high level shifters are needed to pass signals (e.g. configuration signals, trim signals, etc.) from the digital circuits to the analog circuits, and high-to-low level shifters are needed to pass signals from the analog circuits to the digital circuits.

Such mixed-signal circuits may include hundreds of such level shifters resulting in current spikes in the hundreds of mA for tens of nano-seconds at start-up, POR or at other times. For example, if there are 500-1000 level shifters, a spike current in the range of 200 mA can be drawn for 10-30 ns from a high supply voltage (e.g. 3.3V), and 20-50 mA can be drawn from a low power supply (1.8V).

Such current spikes can disrupt proper circuit operation, especially when the lower supply voltage is generated by a cap-less low-dropout (LDO) voltage regulator, which have very limited output current capabilities. For example, a main power supply may mandate a low ohmic path to avoid collapse of the output of level shifters which may cause malfunctioning of analog blocks. Also sinking a mA current for 10s from the low supply can cause a similar issue for the digital core which receives analog signals. Further, if a capless LDO with limited current capability is being used, sinking mA range current causes collapse of LDO output voltage which is the supply for the digital core, consequently, the collapse of the digital core. As a result, mixed-signal chips utilizing multi-power supply levels may never wake-up properly.

FIG. 1 represents an example multi-power source mixed-signal circuit 100. The circuit 100 includes a digital circuit core 102, an analog circuit core 104, a low-voltage power supply (V-low) 106, a high-voltage power supply (V-high) 108, a set of level-shifters 110, a low to high (L2H) level shift path 112, a high to low (H2L) level shift path 114, and a control line configured to carry an enable signal 116.

The digital circuit core 102 is supplied by V-low 106, and the analog circuit core 104 are supplied by V-high 108 (and sometimes V-low 106 as well). Various configuration and control signals are exchanged between the digital circuit core 102 and the analog circuit core 104 using the low to high (L2H) level shift path 112 and the high to low (H2L) level shift path 114. For example trim values at V-low 106 need to shift up to V-high 108, and vice versa. Signals from the analog core 104 must be down shifted from V-high 108 to V-low 106 before entering the digital core 102 using the set of level-shifters 110.

The enable signal 116 enables L2H (low to high) and H2L (high to low) level shifters when the V-low 106 and the V-high 108 are available. The steady state current of each level shifter can be zero, and if an input of a level shifter toggles, an average dynamic current of the level shifter is relatively small too.

However, when all the level-shifters 110 are enabled (together) and/or when all the input values change at a same time (e.g. at power up, POR, etc.), then even though a shoot through current of each level shifter maybe in the range of a few 10s of uA, the total overall shoot through current may be in the range of 100s of mA.

While using a stable high-current power supply for V-low 106 and V-high 108 may be able to deliver such a shoot through current, some power supplies (e.g. a small integrated capless LDO with a few mA range current delivery capability) could have a voltage collapse and in some example applications put the mixed-signal circuit 100 in continuous cycling POR condition such that the mixed-signal circuit 100 may never wake up and start working properly.

Now discussed are power application circuits for reducing transient current spikes while selectively enabling and supplying power to a set of load circuits. Using such power application circuits, in some applications a transient current drawn by a set of load circuits can be significantly reduced by an order of magnitude (e.g. by a factor of 10-20). For example, in an application using a cap-less low-dropout (LDO) voltage regulator (i.e. a power supply using only capacitors internal to a semiconductor chip in which the power supply is embedded, and which does not use an external capacitor), these power application circuits can limit current draw of a set of loads (e.g. level shifters) during power up which avoids collapsing (i.e. preventing proper operation of) the capless LDO power supply.

Figure 2A:
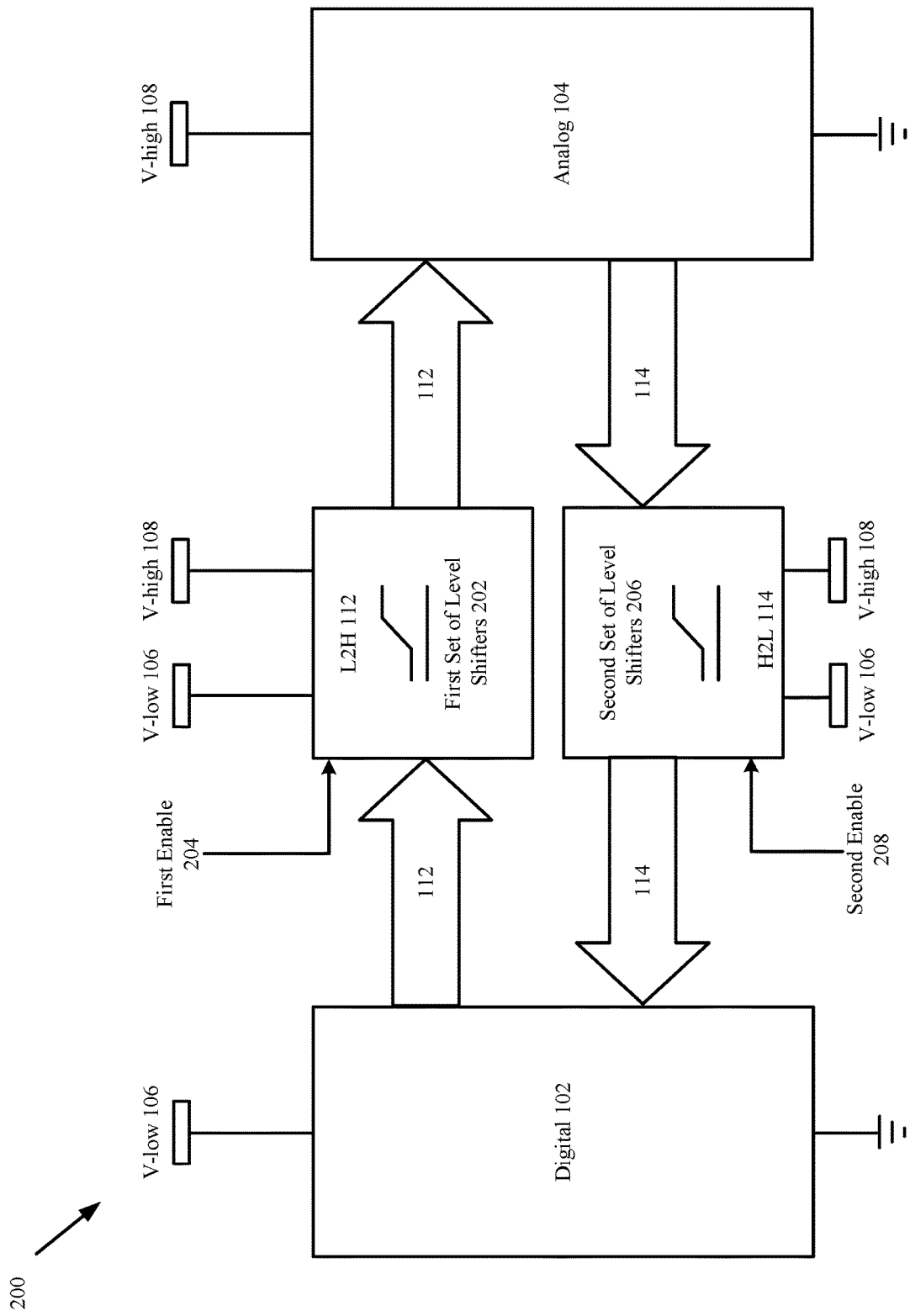
FIGS. 2A and 2B represent a first example power application circuit.
Figure 2B:
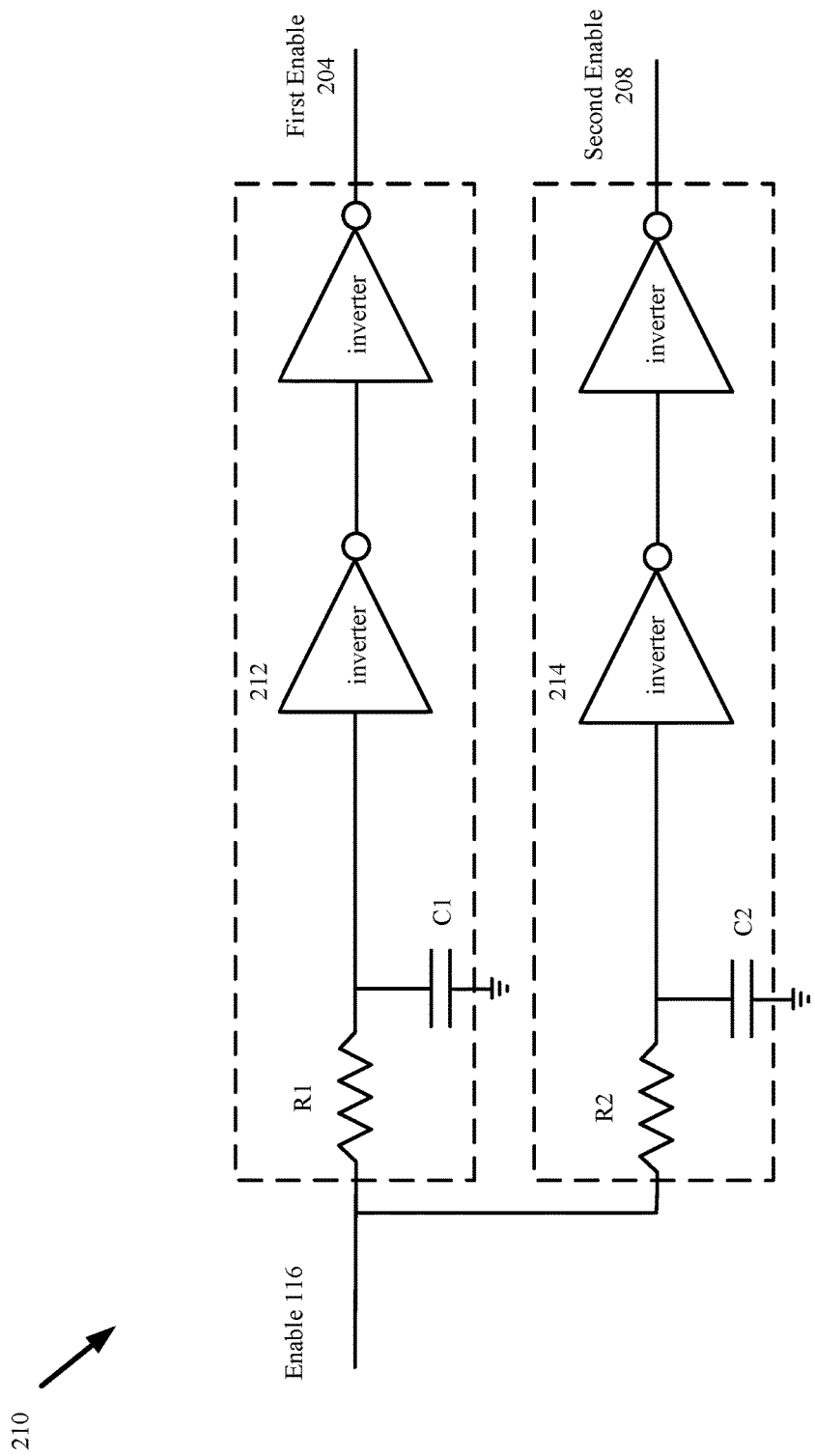

FIGS. 2A and 2B represent a second example multi-power source mixed-signal circuit 200. The second example multi-power source mixed-signal circuit 200 shares some similar elements from the first example multi-power source mixed-signal circuit 100 but with the following differences.

The set of level-shifters 110 has been divided into a first set of level-shifters 202 for the low to high (L2H) level shift path 112 and a second set of level-shifters 206 for the high to low (H2L) level shift path 114. Also the first set of level-shifters 202 is activated by a control line configured to carry a first enable signal 204, and the second set of level-shifters 206 is activated by a second control line configured to carry a second enable signal 208.

The enable signal 116 is received by a first delay circuit 210 and a second delay circuit 212. The first delay circuit 210 adds a first RC delay (i.e. R1 and C1) to the enable signal 116 and outputs the first enable signal 204 to the first set of level-shifters 202. The second delay circuit 212 adds a second RC delay (i.e. R2 and C2) to the enable signal 116 and outputs the second enable signal 208 to the second set of level-shifters 206.

Since the first set of level-shifters 202 and the second set of level-shifters 206 are enabled at different times, a shoot through current from the low-voltage power supply (V-low) 106 and the high-voltage power supply (V-high) 108 can be reduced by up to 50%.

By dividing the set of level-shifters 110 in to a greater and greater number of separately enabled groups, the shoot through current can be reduced by any desired amount. However, such additional separately enabled groups of level-shifters with their companion separate delay paths can exceed a chip's design limits (e.g. complexity, silicon area, etc.) in some cases.

In other example embodiments, shoot through current can be reduced by adding a series resistor from each power supply (i.e. V-low 106 and V-high 108) to the set of level shifters 110, whether or not they are separately grouped (e.g. into 202 and 206) which will limit a maximum current delivered to the set of level shifters 110. This approach in some cases may limit an actual received power supply level at the set of level shifters 110 to a non-predicted value during the power up and transitions and may cause malfunctioning.

Figure 3A:
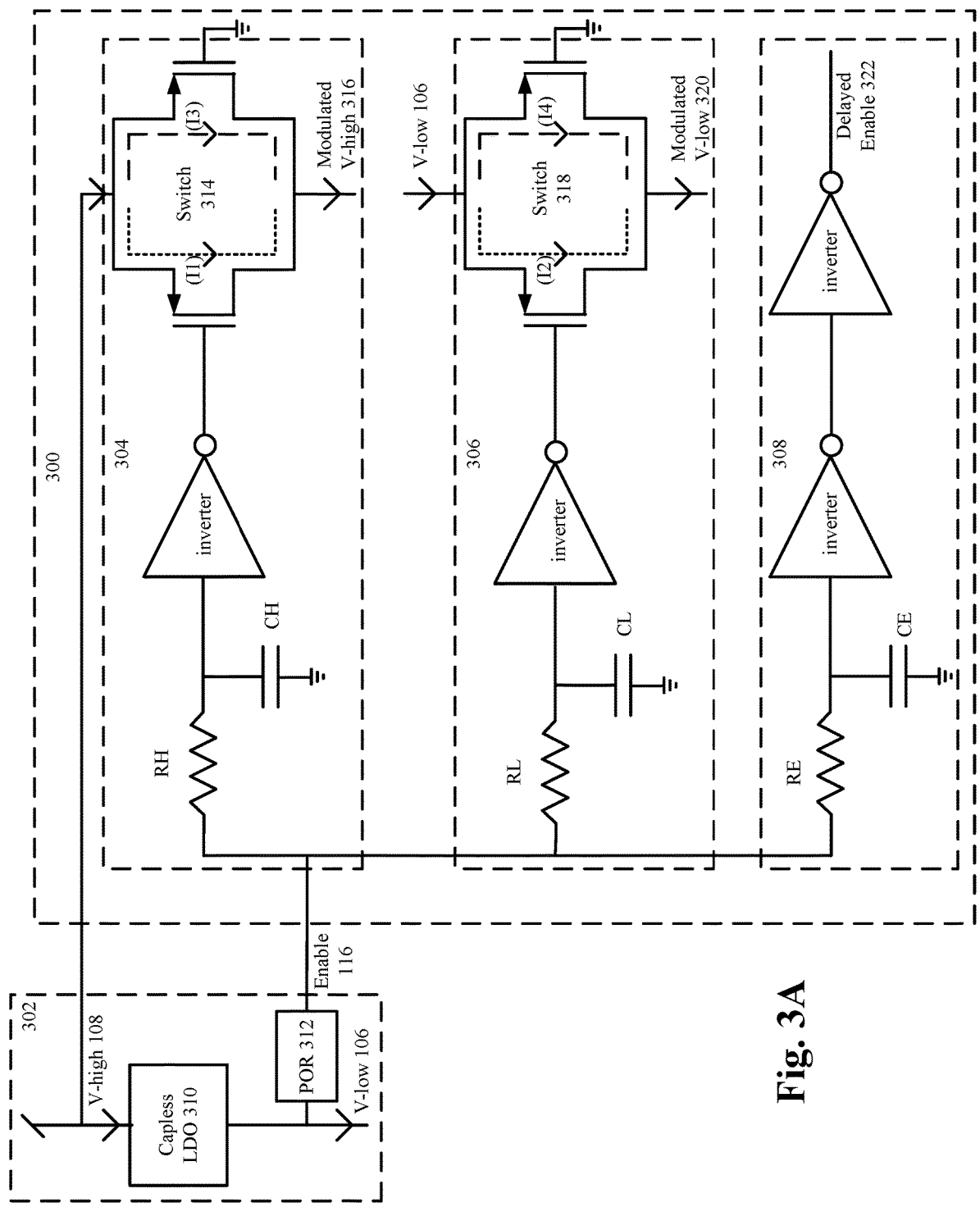
FIGS. 3A and 3B represent a second example power application circuit.
Figure 3B:
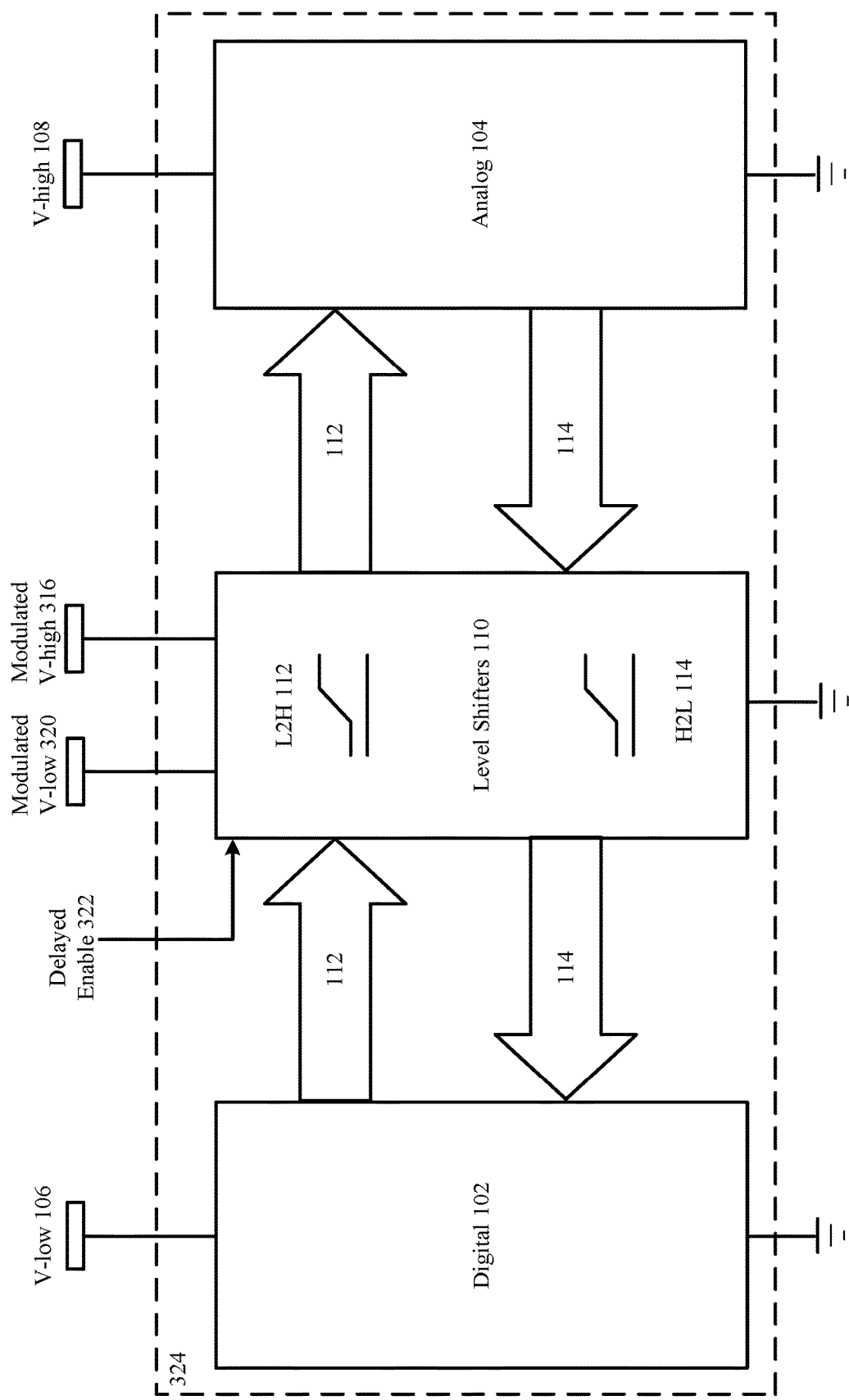

FIGS. 3A and 3B represent a second example power application circuit 300. The second example power application circuit 300 is coupled to a main power supply 302. The main power supply 302 in this example embodiment receives the first voltage (V-high) 108 (e.g. supporting analog circuits and signals) and includes a capless LDO 310, and a POR (power on reset) circuit 312. The capless LDO 310 voltage converts the first voltage (V-high) 108 to the second voltage (V-low) 106 (e.g. supporting digital circuits and signals). The POR 312 generates the enable signal 116 based on ramp-up of one or more of the main power supply 302 internal voltages.

The second example power application circuit 300 includes a first power application circuit 304, a second power application circuit 306, and an enable signal circuit 308.

The first power application circuit 304 is coupled to receive the first voltage (V-high) 108 and the enable signal 116. The first power application circuit 304 includes a first delay circuit (RH and CH), an inverter, and a first set of switches 314 having two current paths (e.g. first current path (I1) and third current path (I3)). The first power application circuit 304 generates a modulated V-high voltage 316.

The second power application circuit 306 is coupled to receive the second voltage (V-low) 106 and the enable signal 116. The second power application circuit 306 includes a second delay circuit (RL and CL), an inverter, and a second set of switches 318 having two current paths (e.g. second current path (I2) and fourth current path (I4)). The second power application circuit 306 generates a delayed V-low voltage 320.

The enable signal circuit 308 is coupled to receive the enable signal 116. The enable signal circuit 308 includes a third delay circuit (RE and CE) and generates a delayed enable signal 322.

The first, second and third delay circuits include but are not limited to RC cells. in other example embodiments, inverter chains or any form of analog delays can be used as well.

The second example power application circuit 300 is coupled to a third example multi-power source mixed-signal circuit 324 as shown in FIG. 3B. The third example multi-power source mixed-signal circuit 324 is substantially the same as the first example multi-power source mixed-signal circuit 100 in FIG. 1 but with the following differences.

As shown in FIG. 3B, the set of level-shifters 110, instead of directly receiving current from the high-voltage power supply (V-high) 108, receives a delayed current via the first current path (I1) and a continuous current via the third current path (I3). Also, the set of level-shifters 110, instead of directly receiving current from the low-voltage power supply (V-low) 106, receives a delayed current via second current path (I2) and a continuous current via the fourth current path (I4). Additionally, the set of level-shifters 110, instead of directly receiving the enable signal 116, receive the delayed enable signal 322.

Selectively delayed operation of the first current path (I1) in the first set of switches 314 and the second current path (I2) in the second set of switches 318 thereby delays application of full power at V-high 108 and V-low 106 to the set of level-shifters 110 and thereby controls/reduces any V-high/V-low shoot through current spike in the set of level-shifters 110. In various example embodiments, the modulated V-high voltage 316 may be applied to the analog circuit core 104, and the modulated V-low voltage 320 may be applied to the digital circuit core 102.

The third current path (I3) and the fourth current path (I4) are always ON (i.e. providing continuous current) which provides an acceptable current for the set of level-shifters 110 whenever is needed, and the first current path (I1) and the second current path (I2) are controlled and turn ON after a predetermined proper delay(s). By enabling different subgroups of level shifters with different delays, any shoot through current spikes can be significantly reduced and/or distributed over a selected time period. Each delay circuit's RC values and size of the switches 314, 318 can be customized to provide a minimum spike current.

Example embodiments of the switches 314, 318 may utilize one PMOS switch which is always ON, by connecting its gate to ground, and the other PMOS switch's gate is controlled and makes the PMOS ON with proper delay(s).

Thus the supply current for each level shifter in the set of level-shifters 110 has two paths now: the always ON, and the controlled path (with controlled delay). The always ON path is there to make sure there is a current provided at all time, and turn ON/OFF time is not too long, which otherwise might cause operational problems. The controlled path adds a second path for current to make sure level shifters have enough current to make the transition properly, whether it is to turn ON, or to obtain a new value. In alternate example embodiments NMOS or any controlled resistor could be utilized instead of PMOS devices. Also, there can be more than two current paths if needed by adding additional MOS devices to the switches 314, 318.

FIGS. 4A, 4B and 4C represent example transient (e.g. shoot through) current waveforms 400.

FIG. 4A is an example transient current from the capless LDO 310 output at V-low 106. FIG. 4B is an example transient current from the main power supply 302 output at V-high 108. FIG. 4C is an example total transient current from the main power supply 302 at start-up.

The top waveform in in each of the FIGS. 4A, 4B, 4C is without the power application circuit 300, and the bottom waveform in each of the FIGS. 4A, 4B, 4C is with the power application circuit 300.

Example data set values for these waveforms are: T1~0.5 us, T2~1 uA, T3~10 ns, T4 ~1 us, T5~10 ns, T6~0.3 us and I1~2 mA, I2~0.5 mA, I3~220 mA, I4~6 mA, I5~60 mA, I6~4 mA. Note the I1, I2, I3, I4 references here are different from those discussed in FIGS. 3A and 3B.

As shown, whether it is the transient current to turn the level shifters ON or when enabled, the peak/spike current is significantly reduced. In various example embodiments this helps the internal LDO which generates the V-low supply for digital much more robust and also it makes the V-high supply (although an input to the chip) robust as well, since the analog blocks utilize V-high and could be very sensitive to supply variations (which happens when there is a large surge/spike in the current).

Various instructions and/or operational steps discussed in the above Figures can be executed in any order, unless a specific order is explicitly stated. Also, those skilled in the art will recognize that while some example sets of instructions/steps have been discussed, the material in this specification can be combined in a variety of ways to yield other examples as well, and are to be understood within a context provided by this detailed description.

In some example embodiments these instructions/steps are implemented as functional and software instructions. In other embodiments, the instructions can be implemented either using logic gates, application specific chips, firmware, as well as other hardware forms.

When the instructions are embodied as a set of executable instructions in a non-transitory computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

What is claimed is:

1. A power application circuit, comprising:
   a first power application circuit, coupled to receive an enable signal and a first voltage both from a main power supply circuit;
   wherein the first power application circuit is configured to output the first voltage at a first current after a first delay from when the enable signal is received;
   a second power application circuit, coupled to receive the enable signal and a second voltage both from the main power supply circuit;
   wherein the second power application circuit is configured to output the second voltage at a second current after a second delay from when the enable signal is received;
   wherein the main power supply circuit includes a voltage regulator configured to receive and convert the first voltage into the second voltage;
   wherein the main power supply circuit includes a power on reset (POR) circuit configured to generate the enable signal in response to a predetermined value of either the first voltage or the second voltage;
   wherein the main power supply circuit including the voltage regulator and the POR circuit are embedded in a semiconductor chip.

2. The circuit of claim 1:
   an enable signal circuit configured to receive the enable signal;
   wherein the enable signal circuit is configured to output a delayed enable signal after a third delay from when the enable signal is received.

3. The circuit of claim 1:
   wherein the first power application circuit includes a first switch configured to output the first voltage at the first current after the first delay from when the enable signal is received.

4. The circuit of claim 3:
   wherein the second power application circuit includes a first switch configured to output the second voltage at the second current after the second delay from when the enable signal is received.

5. The circuit of claim 4:
   wherein the first power application circuit includes a second switch configured to continuously output the first voltage at a third current.

6. The circuit of claim 5:
   wherein the second power application circuit includes a second switch configured to continuously output the second voltage at a fourth current.

7. The circuit of claim 1:
   wherein the first power application circuit is configured to supply the first voltage and the first current to a set of level shifters; and
   wherein the second power application circuit is configured to supply the second voltage and the second current to the set of level shifters.

8. The circuit of claim 7:
   wherein the set of level shifters are configured to power on in response to receiving the enable signal.

9. The circuit of claim 7:
   wherein the set of level shifters are configured to power on in response to receiving the delayed enable signal.

10. The circuit of claim 7:
    wherein the set of level shifters are coupled between a digital circuit and an analog circuit.

11. The circuit of claim 10:
    wherein the set of level shifters are configured to convert an analog signal at the first voltage received from the analog circuit to a digital signal at the second voltage sent to the digital circuit; and
    wherein the set of level shifters are configured to convert a digital signal at the second voltage received from the digital circuit to an analog signal at the first voltage sent to the analog circuit.

12. The circuit of claim 10:
    wherein the first power application circuit is configured to supply power to the digital circuit, and the second power application circuit is configured to supply power to the analog circuit.

13. The circuit of claim 10:
    wherein the digital circuit, the analog circuit, the first power application circuit, and the second power application circuit are configured to receive power directly from the main power supply circuit.

14. The circuit of claim 1:
    wherein the first power application circuit is configured to supply power to a first set of level shifters; and
    wherein the second power application circuit is configured to supply power to a second set of level shifters that are different from the first set of level shifters.

15. The circuit of claim 1:
    wherein the power application circuit is configured to be coupled to supply the first voltage, the first current, the second voltage, and the second current to a multi-power source mixed-signal circuit.

16. The circuit of claim 1:
    wherein the power application circuit is configured to receive power from an external power supply.

17. The circuit of claim 1:
- wherein the voltage regulator is a cap-less voltage regulator;
- wherein the capless voltage regulator is configured to convert the first voltage to the second voltage using only a capacitor internal to the semiconductor chip in which the main power supply circuit is embedded.

18. The circuit of claim 1:
- wherein the first power application circuit is configured to supply the first voltage and the first current to a first set of circuits after the first delay resulting in a first shoot-through current;
- wherein the second power application circuit is configured to supply the second voltage and the second current to a second set of circuits after the second delay resulting in a second shoot-through current;
- wherein the enable signal circuit is configured to output the delayed enable signal to both the first set of circuits and the second set of circuits after the third delay resulting in a third shoot-through current;
- wherein both the first and second delays are less than the third delay; and
- wherein the main power supply circuit has a maximum current output that is less than a total of the first, second, and third shoot-through currents.

* * * * *